United States Patent

Chen

[11] Patent Number: 5,274,261
[45] Date of Patent: Dec. 28, 1993

[54] INTEGRATED CIRCUIT DEGRADATION RESISTANT STRUCTURE

[75] Inventor: Ih-Chin Chen, Richardson, Tex.

[73] Assignee: Texas Instruments Incorporated, Dallas, Tex.

[21] Appl. No.: 943,102

[22] Filed: Sep. 10, 1992

Related U.S. Application Data

[63] Continuation of Ser. No. 742,285, Aug. 8, 1991, abandoned, which is a continuation of Ser. No. 560,710, Jul. 31, 1990, abandoned.

[51] Int. Cl.$^5$ .................. H01L 29/76; H01L 29/94
[52] U.S. Cl. .................. 257/344; 257/900; 257/408
[58] Field of Search .......... 437/44; 357/23.11, 23.3, 357/23.14; 257/408, 344, 900

[56] References Cited

U.S. PATENT DOCUMENTS

| | | | |
|---|---|---|---|
| 4,717,941 | 1/1988 | Yamazaki | 357/23.3 |
| 4,855,247 | 8/1989 | Ma et al. | 357/23.3 |
| 4,868,617 | 9/1989 | Chiao et al. | 357/23.3 |
| 4,876,213 | 10/1989 | Pfiester | 357/23.3 |
| 4,908,326 | 3/1990 | Ma et al. | 357/23.3 |
| 4,908,327 | 3/1990 | Chapman | 257/408 |
| 4,925,807 | 5/1990 | Yoshikawa | 357/23.3 |
| 4,951,100 | 8/1990 | Parrillo | 357/23.3 |
| 4,971,922 | 11/1990 | Watabe et al. | 357/23.3 |
| 5,016,077 | 5/1991 | Sato et al. | 257/408 |
| 5,024,960 | 6/1991 | Haken | 257/408 |
| 5,086,006 | 2/1992 | Asahina | 257/408 |

FOREIGN PATENT DOCUMENTS

| | | | |
|---|---|---|---|
| 59-231864 | 12/1984 | Japan | 357/23.3 |
| 61-274365 | 12/1986 | Japan | 357/23.3 |
| 62-136022 | 6/1987 | Japan | 437/44 |
| 62-248256 | 10/1987 | Japan | 357/23.14 |
| 63-54770 | 3/1988 | Japan | 357/23.3 |
| 63-296374 | 12/1988 | Japan | 357/23.3 |

OTHER PUBLICATIONS

Tiao-Yuan Huang et al. Article entitled "A Novel Submicron LDD Transistor With Inverse-T Gate Structure," IEDM, 1986, pp. 742-745.

K. Mayaram, J. Lee & C. Hu, Article entitled "A Model for the Electric Field in Lightly Doped Drain Structures," IEEE Trans. on Elec. Dev., vol. ED-34, No. 7, p. 1509 (1987).

R. Izawa et al. Article entitled "Impact of the Gate-Drain Overlapped Device (Gold) for Deep Submicrometer VLSI," IEEE Trans. on Electron Device, vol. 35, No. 12, (1988), pp. 2088-2093.

I. C. Chen et al. Article entitled "Simple Gate-to-Drain Overlapped Mosfet's Using Poly Spacers for High Immunity to Channel Hot-Electron Degradation," IEEE, Feb. 1, 1990, IEEE Electron Device Letters, vol. 11, No. 2, pp. 78-81.

Tiao-Yuan Huang, et al. Article entitled "Eliminating Spacer-Induced Degradations in LDD Transistors," Proceedings of 1987 International Symposium on VSLI Technology System and Applications (Taipei, Taiwan), pp. 260-264.

*Primary Examiner*—William Mintel
*Assistant Examiner*—Steven Loke
*Attorney, Agent, or Firm*—Peter T. Rutkowski; Richard Donaldson; William E. Hiller

[57] ABSTRACT

A transistor (10) having a gate region formed with a thin oxide layer (28) over the gate (24). The gate (24) has a polysilicon spacer (34) formed adjacent to the gate (24) for increasing the resistance to channel hot-electron-induced degradation.

7 Claims, 4 Drawing Sheets

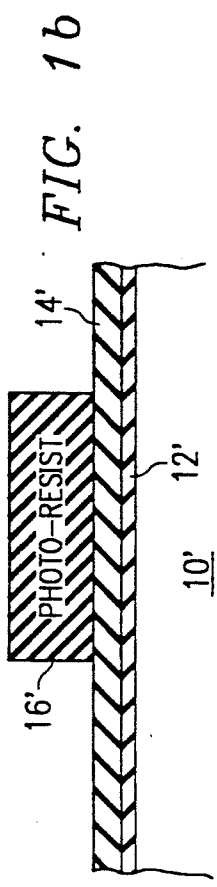
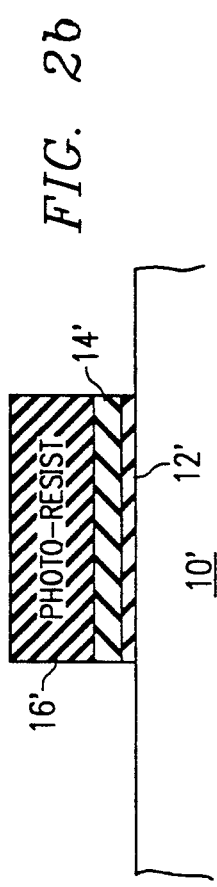
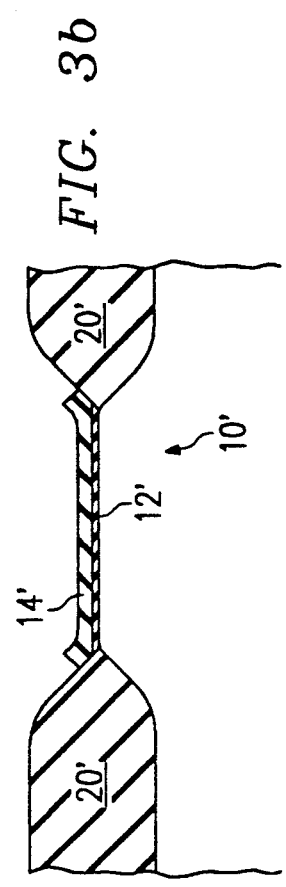
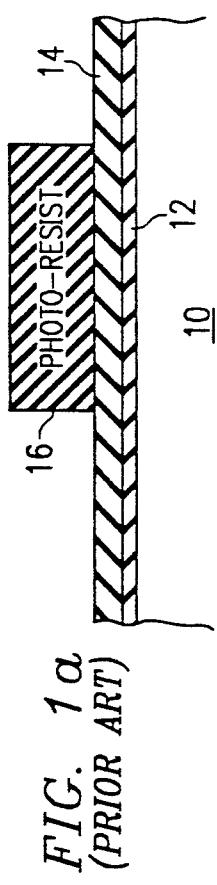
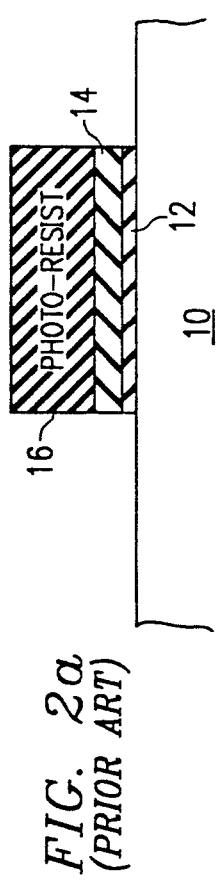
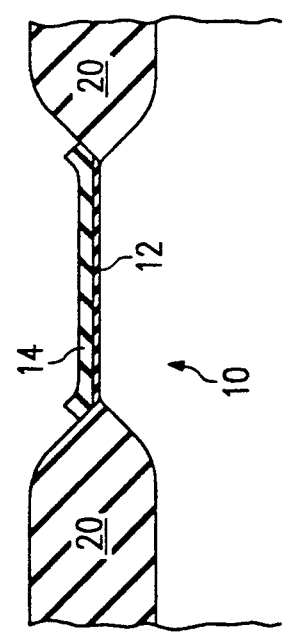

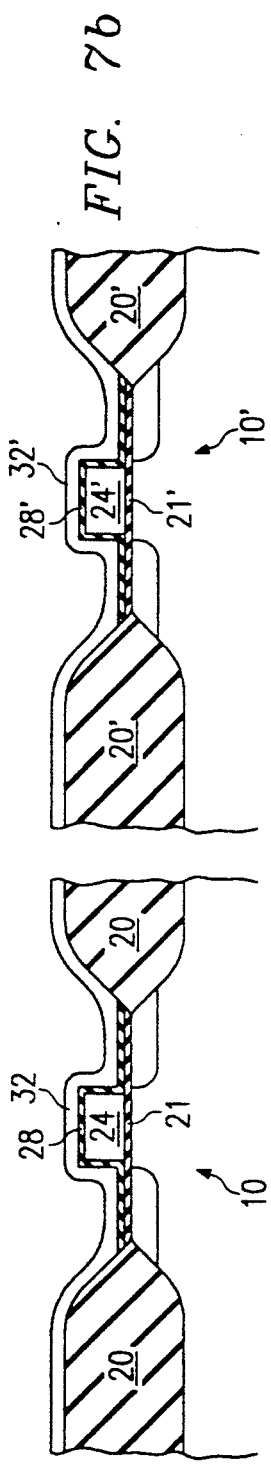
FIG. 7a (PRIOR ART)
FIG. 7b
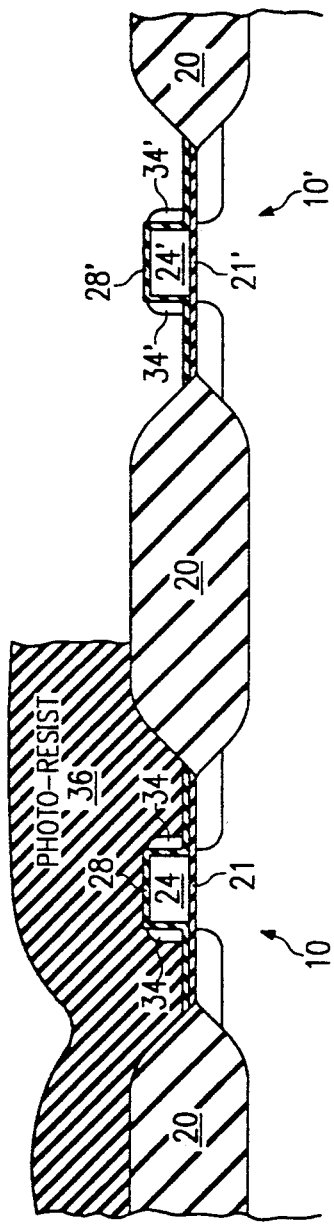
FIG. 8
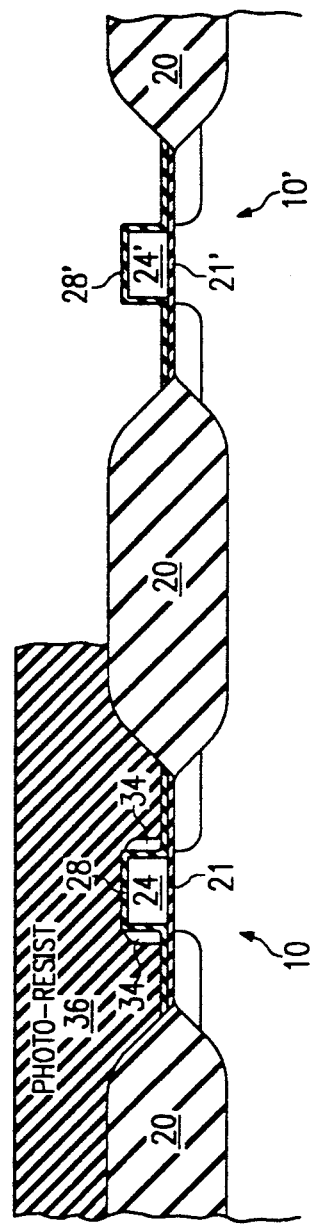
FIG. 9

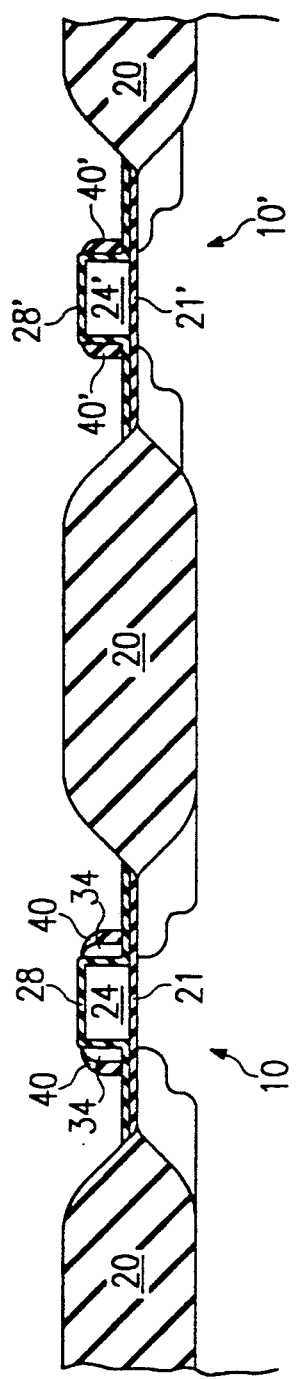

INTEGRATED CIRCUIT DEGRADATION RESISTANT STRUCTURE

This application is a continuation of application Ser. No. 07/742,285 filed Aug. 8, 1991, now abandoned, which is a continuation of parent application Ser. No. 07/560,710 filed Jul. 31, 1991, now abandoned.

TECHNICAL FIELD OF THE INVENTION

This invention relates in general to a transistor and a process for generating the same, and in particular to a transistor having a polysilicon spacer and oxide spacer formed adjacent to a gate for increasing the resistance to channel hot-electron-induced degradation.

BACKGROUND OF THE INVENTION

As the semiconductor industry advances, the search for smaller integrated circuit chips intensifies. This search includes many experiments concerning various structural configurations that utilize many different materials. Unfortunately, not all these experiments have been fruitful. For example, as the search for higher current devices has increased, so has the degree of failure in the integrated circuits due to structural meltdown and inadvertent electrical degradations. When the size of integrated circuits is decreased, there is a corresponding increase in channel hot-electron-induced degradation in transistors having a high voltage applied thereto.

Many devices have been successfully designed to work around the problem that has caused integrated circuits to have hot-electron-induced degradation at the gate. Despite the presence of these commonly reoccurring drain-to-gate shorts, there has been a lack of concentration on isolating these trouble areas on the integrated circuit board where shorts are more commonly located. In fact, prior art studies have been made to determine where physically "hot spots" are located on integrated circuit boards. If the integrated circuit were designed to minimize the circuitry located at these "hot spots", then the integrity of the integrated circuit could be served by limiting failure at these critical points on the integrated circuit chip.

The present invention recognizes the use of a polysilicon space formed adjacent to a gate of a transistor in conjunction with an oxide spacer formed on the polysilicon spacer transistor for increasing resistance to channel hot-electron-induced degradation.

Accordingly, there exists a need in the art for an arrangement which reduces degradation of circuitry on integrated circuit chips.

SUMMARY OF THE INVENTION

One aspect of the invention is the formation of a transistor gate on a substrate surface. A thin layer of oxide is formed on the gate. After the thin oxide layer has been deposited, a polysilicon wall is formed adjacent to the oxide layer to function as a spacer for controlling the distance between a contact and a gate. The hot-electron-induced degradation can be reduced by incorporating this polysilicon wall adjacent to the gate. In addition, an oxide layer can be formed adjacent to the polysilicon wall for completing the structure of the present invention.

In its preferred embodiment, the integrated circuit has a plurality of polysilicon spacers positioned at "hot spots" along the chip. These "hot-spots" are generally the areas along the integrated circuit board which experience a high degree of hot-electron-induced degradation. By forming the polysilicon walls at these locations, the designer of the integrated circuit is able to reduce the failure rate by reducing the extent of electrical shorts.

In an alternative embodiment, the invention comprises an integrated circuit having conventional oxide walls formed adjacent to gates in areas known not to have a high degree of failure. This isolation of the "hot spots" allows for reduced costs and controlled design parameters. The transistor of the present invention is capable of having selective polyspacers along the "hot spots" for controlling the trouble areas of integrated circuits.

The present invention features technical advantages in that it provides an integrated circuit board that is able to reduce the channel hot-electron-induced degradation associated with the trouble areas while still being capable of having conventional spacers at areas which are not as troublesome. By having this design option, the present invention is capable of having simple gate-to-drain overlap MOSFET's using polyspacers for high immunity to channel hot-electron-induced degradation while at the same time having "non-hot areas" with conventional designs.

BRIEF DESCRIPTION OF THE DRAWINGS

The novel features of this invention's structure and operational advantages will be best understood from the accompanying drawings, taken in conjunction with the accompanying description wherein particular reference characters refer to similar parts in all views and in which:

FIGS. 1A and 1B are cross-sectional views of a prior art substrate having a dielectric and photoresist formed thereon;

FIGS. 2A and 2B are cross-sectional views of the prior art substrate as seen in FIGS. 1A and 1B after etching;

FIGS. 3A and 3B are cross-sectional views of the prior art substrate as seen in FIGS. 2A and 2B after a field oxide layer has been formed thereon;

FIGS. 7A and 7B are cross-sectional views of the prior art substrate as seen in FIGS. 6A and 6B having a polysilicon layer formed over the exposed surface;

FIG. 8 illustrates the selective deposition of a photoresist over the area susceptible to hot-electron-induced degradation;

FIG. 9 is a cross-sectional view of the substrate as seen in FIG. 8 after selective etching; and FIG. 10 is a cross-sectional view of the substrate as seen in FIG. 9 illustrating the formation of an oxide wall adjacent to said polysilicon wall of the gate.

DETAILED DESCRIPTION OF THE INVENTION

Figure 4B:
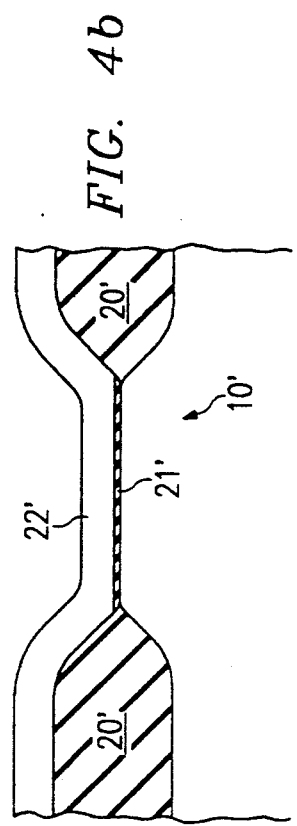
FIGS. 4A and 4B are cross-sectional views of the prior art substrate as seen in FIGS. 3A and 3B having a polysilicon layer formed across its entire surface (with gate oxide underneath it)

According to the present invention, side wall spacers can be formed adjacent to a gate of a transistor in order to increase the resistance to channel hot-electron-induced degradation. One advantage over the prior art is the ability to have hot-electron lifetimes of the polyspacer devices on the order of two to three orders of magnitude longer than that of conventional oxide spacer devices. This improvement is due to the reduced electron trapping in the gate oxide under the side wall spacer. Any disadvantage of higher gate to drain overlap capacitance or weaker gate oxide integrity can be minimized to within 20% of those of oxide spacer devices by short oxidation prior to formation of the polyspacer.

FIGS. 1A and 1B illustrate the initial fabrication of devices 10 and 10'. In reference to both FIGS. 1A and 1B, substrate 10 and 10' have an oxide layer 12 and 12, formed thereon by thermal oxidation. In its preferred embodiment, the oxide layer is approximately 120 Angstroms thick. Nitride layers 14 and 14' are deposited onto the oxide layers 12 and 12', respectively, by LPCVD nitride process. In the preferred embodiment, the nitride layer has a thickness of approximately 2000 Angstroms. After the nitride layer has been deposited onto oxide layers 12 and 12', photoresists 16 and 16' are selectively patterned onto nitride layers 14 and 14' to form the transistor region in subsequent processing.

FIGS. 2A and 2B illustrate the subsequent process of the prior art. An etchant which selectively removes nitride and oxide from substrate 12 is exposed to the substrate in order to form the subsequent dielectric. After the etching process, the photoresist layers 16 and 16' are removed by stripping processes well known in the art.

FIGS. 3A and 3B illustrate the growth of field oxide layers 20 and 20'. In its preferred embodiment, field oxide layers 20 and 20' are grown to a thickness of approximately 7000 Angstroms by exposing the substrate to a steam environment at approximately 1000° C.

Figure 4A:
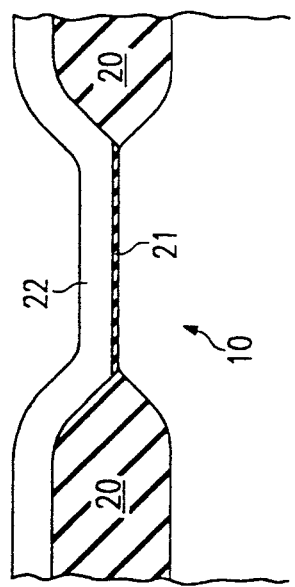

Referring to FIGS. 4A and 4B, subsequent processing can be illustrated. Nitride layers 14 and 14' of FIGS. 3A and 3B are removed by a stripping process well known in the art. After the removal of the nitride layer, gate oxide layers 21 and 21' are formed within the transistor region by exposing the substrate to 850° C. in a dry oxygen environment to form a thickness of approximately 120 Angstroms. After the formation of gate oxide layers 21 and 21', polysilicon layers 22 and 22' are deposited by LPCVD process until they reach a thickness of approximately 2500 Angstroms. It should be understood that simultaneously an in situ doping process is being conducted. After the polysilicon layers 22 and 22' have been deposited, subsequent processing is conducted.

Figure 5B:
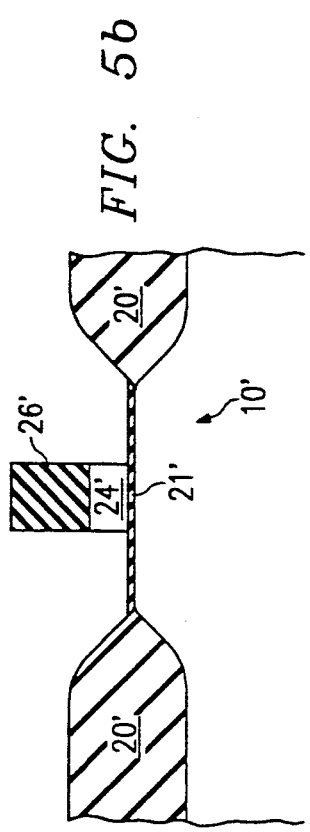
FIGS. 5A and 5B are cross-sectional views of the prior art substrate as seen in FIGS. 4A and 4B after a gate has been selectively etched thereon.
Figure 5A:
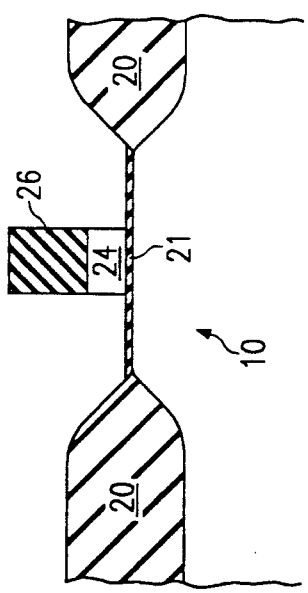

FIGS. 5A and 5B illustrate patterned photo-resist 26 and 26' which are deposited onto polysilicon layers 22 and 22' and an etching process by a hydrogen chloride and hydrogen bromide plus helium environment is conducted to form polygates 24 and 24' which act as the subsequent gates of the transistor.

Figure 6B:
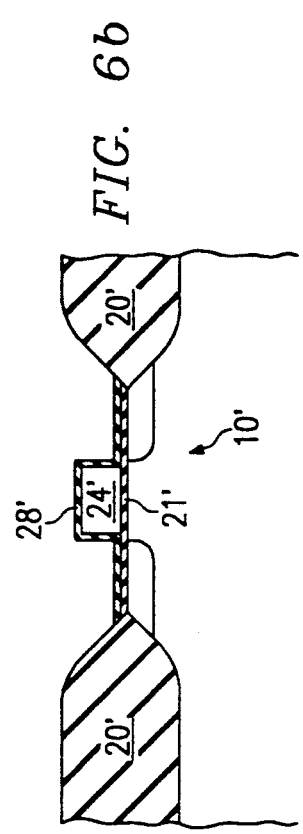
FIGS. 6A and 6B are cross-sectional views of the prior art substrate as seen in FIGS. 5A and 5B after removal of the photoresist and formation of an oxide layer over the gate.
Figure 6A:
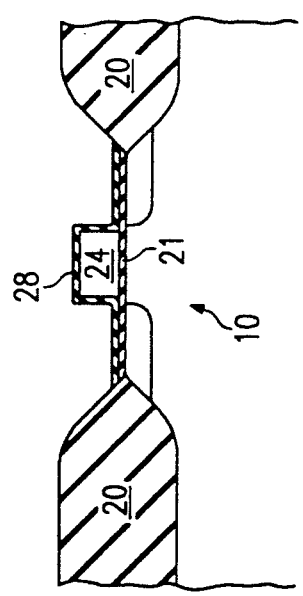

FIGS. 6A and 6B illustrate the formation of thermally grown oxide layers 28 and 28' over the gate 24 after removal of the photoresist. Thermally grown oxide layers 28 and 28' are formed by exposing the substrate to 850° C. for approximately 20 minutes in a dry oxygen atmosphere at room pressure. After the formation of thin oxide layers 28 and 28', the implantation process in the LDD region is conducted by exposing the substrate 12 to phosphorous dopant at 40 KeV having a concentration of 2 to $4 \times 10^{13}$ atoms/cm$^2$.

FIGS. 7A and 7B illustrate the steps of depositing layers of polysilicon 32 and 32' over the entire substrate. The polysilicon is formed by conventional means and is grown to a thickness or deposited to a thickness of approximately 1200 Angstroms.

Referring now to FIG. 8, the selective patterning 36 covers specific gates of transistors. In accordance with the present invention, the substrate has a region of exposed and unexposed surfaces. In operation, substrate 10 and 10' are exposed to an anisotropic etchant to form side wall spacers 34 and 34' which are approximately 15% overetch. After the polyetch has been conducted, the selective photoresist 36 is deposited over selective regions.

Referring to FIG. 9, the polyspacers 34' are selectively etched in the exposed areas by etchant which has a selectivity of polysilicon to oxide of approximately 200 to 1. After the polyspacer 34' has been removed from the device 10', the entire photoresist is removed from substrate 10 and 10'.

Referring to FIG. 10, the preferred embodiment of the present invention can be readily understood. Initially, an oxide layer is deposited to approximately 1200 Angstroms thick by LPCVD deposition process. Subsequently, substrate 10 and 12' are anisotropically etched to form an oxide spacer 40 and 40' adjacent to the sidewalls 34 and the thermal oxide 28'. Finally, the n+ regions are implanted by exposing these regions to an arsenic dopant having a concentration of $3 \times 10^{15}$ atoms/cm$^2$ and an energy level of 100 KeV. The present invention can be more readily understood by reference to the following example in which one particular embodiment of the present invention is disclosed.

Initially, a polyspacer device was fabricated using a CMOS process with 0.8 nanometer design rules. The starting material was a p-type (100) oriented silicon wafer with a resistivity of 10–15 ohms centimeter. After the LOCOS isolation, a 200 Angstrom gate was grown at 850° C. and was exposed to arsenic for 20 minutes at the same temperature. After the gate polysilicon deposition and definition (the polysilicon etching selectivity over oxide being approximately 30 to 1), LDD implant (P, $2 \times 10^{13}$ atoms/cm$_2$) followed. A 0.15 nanometer thick layer of either oxide or polysilicon was then deposited and etched to form the LDD sidewall spacer. For some polyspacer devices, a slight oxidation and a dry oxygen ambient at 850° C. conducted to grow the oxide layer to approximately 100 Angstroms thick was performed before the polysilicon spacer deposition in order to mend the exposed gate oxide during gate etch. The oxidation did not produce significant graded oxide at the gate edge.

All the wafers in the tests were exposed to a source-/drain implant (arsenic), $3 \times 10^{15}$ atoms/cm$^2$ and a thermal steam at 900° C. for 45 minutes in argon. For the oxide-padded polyspacer device, due to the heavy source/drain implant which severely damaged the exposed portion of the thin oxide, the polyspacers were effectively connected to the gate poly through a resist of 1 to 100 M ohms, which is significantly low to maintain the same potential between the polygate and the polyspacer. No electrically floating poly was detected across the wafers. Interlevel oxide (0.7 nanometers) was then deposited and planarized by etching back, and was followed by a contact and metalization process. The wafers were then sintered in hydrogen at 450° C. for 20 minutes and passivated by a stack layer of plasma oxide (0.7 micro meters) and plasma nitride (0.3 micro meters). For the p-channel device with oxide padded polyspacers, the p-type source/drain implant (Boron $3 \times 10^{15}$ atoms/cm$^2$ zero tilt angle through a 300 Angstrom deposition oxide) was also capable of connecting the polyspacers to the gate.

The present invention presents technical features over the prior art, such as the ability to selectively form polysilicon sidewalls to reduce channel hot-electron-induced degradation.

It will be understood that the embodiments described in detail hereinbefore are presented by way of example only and that many changes and modifications can be made thereto without departing from the spirit or scope of the invention.

What is claimed is:

1. An integrated circuit having a plurality of transistors selectively formed to reduce hot-electron-induced degradation of gates of selected ones of said plurality of transistors, said integrated circuit comprising:
    a substrate having a first group of regions and a second group of regions, said second group of regions for forming said selectively formed transistors for reduced hot-electron-induced degradation of gates;
    each one of said first group of regions including a transistor having an oxide spacer positioned adjacent its gate; and
    each one of said second group of regions including a transistor having both a polysilicon spacer positioned adjacent its gate, and an oxide spacer formed adjacent said polysilicon spacer such that said polysilicon spacer is located between said gate and said oxide spacer for reducing hot-electron-induced degradation of its gate.

2. The integrated circuit of claim 1 wherein each of said transistors of said first and second groups of regions are formed over a substrate having a channel region between a source region and a drain region and having said gage overlying said channel region and separated therefrom by a gate oxide layer, an oxide cover layer formed over said gate, including the side walls of said gate, and in contact with said gate oxide layer; and
    each of said transistors of said second group of regions further including said polysilicon spacer formed between said oxide cover layer and said oxide spacer so as to be substantially enclosed.

3. An integrated circuit having a first group of transistors and a second group of transistors, said second group of transistor shaving increased resistance to hot-electron-induced degradation, said integrated circuit comprising:
    a substrate having first regions for forming said first group of transistors therein, and second regions for forming said second group of transistors therein;
    each transistor of said first and second groups defining a channel region between a source region and a drain region and having a gate overlying said channel region, said gate separated from said channel region by a gate oxide;
    an oxide cover layer formed over said first and second groups of transistors, including said source and drain regions and the sidewalls of said gates, said oxide cover layer in contact with said gate oxide layer;
    each one of said first group of transistors including an oxide spacer formed adjacent and in contact with said oxide cover layer where said cover layer covers said sidewalls of the gate; and
    each one of said second group of transistors including a polysilicon spacer formed adjacent and in contact with said oxide cover layer where said cover layer covers said sidewalls of the gate, and each one of said second group of transistors further including an oxide spacer formed adjacent and in contact with said polysilicon spacer and in contact with said oxide cover layer where said cover layer is formed over said source and drain regions.

4. The integrated circuit as recited in claim 3 wherein said oxide cover layer is approximately 100 Angstroms thick.

5. The integrated circuit as recited in claim 3 wherein said polysilicon spacer is formed from a polysilicon layer approximately 1200 Angstroms thick.

6. The integrated circuit as recited in claim 3 wherein said oxide spacer of said first and second groups of transistors, is formed from an oxide layer approximately 1200 Angstroms thick.

7. The integrated circuit of claim 3 wherein said polysilicon spacer is substantially enclosed by said oxide spacer and said oxide cover layer.

* * * * *